US008063852B2

(12) United States Patent
Kwak et al.

(10) Patent No.: US 8,063,852 B2
(45) Date of Patent: Nov. 22, 2011

(54) LIGHT EMITTING DISPLAY AND LIGHT EMITTING DISPLAY PANEL

(75) Inventors: Won-Kyu Kwak, Suwon-si (KR); Sung-Chon Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 936 days.

(21) Appl. No.: 11/239,726

(22) Filed: Sep. 29, 2005

(65) Prior Publication Data

US 2006/0076550 A1    Apr. 13, 2006

(30) Foreign Application Priority Data

Oct. 13, 2004  (KR) .................. 10-2004-0081627

(51) Int. Cl.
*G09G 3/30* (2006.01)
(52) U.S. Cl. ............... 345/76; 345/83; 315/169.3
(58) Field of Classification Search ............ 345/76–83, 345/39, 45–46; 315/169.3
See application file for complete search history.

(56) References Cited

U.S. PATENT DOCUMENTS

| | | | |
|---|---|---|---|
| 5,822,026 A * | 10/1998 | Matsuo | 349/38 |
| 5,952,789 A | 9/1999 | Stewart et al. | |
| 5,966,189 A * | 10/1999 | Matsuo | 349/38 |
| 6,404,410 B1 * | 6/2002 | Shirae | 345/55 |
| 6,421,033 B1 | 7/2002 | Williams et al. | |
| 6,583,775 B1 | 6/2003 | Sekiya et al. | |
| 6,618,031 B1 * | 9/2003 | Bohn et al. | 345/83 |
| 6,686,985 B1 * | 2/2004 | Tanaka et al. | 349/143 |
| 6,768,482 B2 | 7/2004 | Asano et al. | |
| 6,771,028 B1 * | 8/2004 | Winters | 315/169.1 |
| 6,919,681 B2 * | 7/2005 | Cok et al. | 313/500 |
| 6,933,756 B2 | 8/2005 | Miyazawa | |
| 7,336,251 B2 | 2/2008 | Osada | |
| 7,394,513 B2 * | 7/2008 | Andou et al. | 349/145 |
| 7,535,447 B2 * | 5/2009 | Kwak et al. | 345/87 |

(Continued)

FOREIGN PATENT DOCUMENTS

CN    1143232 A    2/1997

(Continued)

OTHER PUBLICATIONS

Patent Abstracts of Japan, Publication No. 2002-198174; Date of Publication: Jul. 12, 2002; in the name of Yuichi Ikezu et al.

(Continued)

*Primary Examiner* — Jason Mandeville
(74) *Attorney, Agent, or Firm* — Christie, Parker & Hale, LLP (57) ABSTRACT

A display device according to an embodiment of the present invention includes a pixel driver, first, second, and third light emitting diodes, and first, second, and third switches. The pixel driver outputs a driving current corresponding to a data signal to an output terminal in response to the scan signal. The first, second, and third light emitting diodes emit first, second, and third color lights in response to the driving current respectively. The first, second, and third switches are coupled between the output terminal of the pixel driver and the first, second, and third light emitting diodes respectively. The first, second, and third switches selectively transmit the driving current to the first, second, and third light emitting diodes. Two of light emitting diodes among the first, second, and third light emitting diodes are arranged in a first line, and the remaining one light emitting diode is arranged in a second line different from the first line.

9 Claims, 6 Drawing Sheets

U.S. PATENT DOCUMENTS

| | | | |
|---|---|---|---|
| 7,561,124 B2 * | 7/2009 | Kwak et al. | 345/76 |
| 7,880,698 B2 * | 2/2011 | Park et al. | 345/82 |
| 2002/0000576 A1 | 1/2002 | Inukai | |
| 2002/0021293 A1 | 2/2002 | Tam | |
| 2002/0070909 A1 * | 6/2002 | Asano et al. | 345/76 |
| 2002/0118150 A1 | 8/2002 | Kwon | |
| 2003/0062524 A1 | 4/2003 | Kimura | |
| 2003/0094612 A1 | 5/2003 | Yamazaki et al. | |
| 2003/0117348 A1 * | 6/2003 | Knapp et al. | 345/76 |
| 2003/0132896 A1 | 7/2003 | Matsueda | |
| 2004/0100427 A1 | 5/2004 | Miyazawa | |
| 2004/0113922 A1 | 6/2004 | Choe et al. | |
| 2004/0183758 A1 | 9/2004 | Chen et al. | |
| 2004/0217694 A1 | 11/2004 | Cok et al. | |
| 2004/0263499 A1 | 12/2004 | Tanada et al. | |
| 2005/0024305 A1 | 2/2005 | Park | |
| 2005/0052365 A1 | 3/2005 | Jang | |
| 2005/0068271 A1 * | 3/2005 | Lo | 345/76 |
| 2005/0083271 A1 | 4/2005 | Suh et al. | |
| 2005/0093791 A1 | 5/2005 | Lo | |
| 2005/0104817 A1 * | 5/2005 | Kwak | 345/76 |
| 2005/0190126 A1 | 9/2005 | Kimura et al. | |
| 2005/0259142 A1 * | 11/2005 | Kwak | 347/238 |
| 2006/0038752 A1 | 2/2006 | Winters | |
| 2006/0061531 A1 * | 3/2006 | Park et al. | 345/88 |
| 2006/0132668 A1 * | 6/2006 | Park et al. | 349/48 |
| 2006/0139257 A1 * | 6/2006 | Kwak et al. | 345/76 |

FOREIGN PATENT DOCUMENTS

| | | |
|---|---|---|
| CN | 1361510 | 7/2002 |
| CN | 1376014 A | 10/2002 |
| CN | 1410962 A | 4/2003 |
| CN | 1444197 A | 9/2003 |
| CN | 1455914 A | 11/2003 |
| CN | 1460240 A | 12/2003 |
| CN | 1479272 A | 3/2004 |
| CN | 1497522 A | 5/2004 |
| CN | 1530910 A | 9/2004 |
| CN | 1551383 A | 12/2004 |
| EP | 1 215 651 A2 | 6/2002 |
| JP | 9-138659 | 5/1997 |
| JP | 2001-318628 | 11/2001 |
| JP | 2002-023697 | 1/2002 |
| JP | 2002-175029 | 6/2002 |
| JP | 2002-198174 | 7/2002 |
| JP | 2002-215093 | 7/2002 |
| JP | 2002-215096 | 7/2002 |
| JP | 2002-515096 | 7/2002 |
| JP | 2002-221917 | 8/2002 |
| JP | 2003-043999 | 2/2003 |
| JP | 2003-108032 | 4/2003 |
| JP | 2003-122306 | 4/2003 |
| JP | 2003-216100 | 7/2003 |
| JP | 2004-133240 | 4/2004 |
| JP | 2004/279548 | 10/2004 |
| JP | 2005-031630 | 2/2005 |
| KR | 2000-0039659 | 7/2000 |
| KR | 2001-0050783 | 6/2001 |
| KR | 2002-0025842 | 4/2002 |
| KR | 2002-0040613 | 5/2002 |
| KR | 2003-0027858 | 4/2003 |
| KR | 2003-0086166 | 11/2003 |
| KR | 10-2004-0029242 | 4/2004 |
| WO | WO 03/044762 A1 | 5/2003 |
| WO | WO 03/071511 | 8/2003 |

OTHER PUBLICATIONS

Patent Abstracts of Japan, Publication No. 2002-221917; Date of Publication: Aug. 9, 2002; in the name of Shin Asano et al.

Korean Patent Abstracts, Publication No. 1020030027858 A; Date of Publication: Apr. 7, 2003; in the name of Katsuya Anzai.

U.S. Office action dated Nov. 13, 2008, for related U.S. Appl. No. 11/129,016, indicating relevance of listed U.S. references in this IDS.

U.S. Notice of Allowance dated Nov. 4, 2008, for related U.S. Appl. No. 11/274,042, indicating relevance of listed U.S. references in this IDS.

Patent Abstracts of Japan, Publication No. 2001-318628, dated Nov. 16, 2001, in the name of Shunpei Yamazaki et al.

Patent Abstracts of Japan, Publication No. 2002-023697, dated Jan. 23, 2002, in the name of Kazutaka Inukai.

Patent Abstracts of Japan, Publication No. 2002-215093 dated Jul. 31, 2002, in the name of Akira Yumoto et al.

Patent Abstracts of Japan, Publication No. 2002-215096, dated Jul. 31, 2002, in the name of Oh-Kyong Kwon.

Patent Abstracts of Japan, Publication No. 2003-043999, dated Feb. 14, 2003, in the name of Suzuki.

Patent Abstracts of Japan, Publication No. 2003-216100, dated Jul. 30, 2003, in the name of Hiroshi Takahara.

Korean Patent Abstracts, Publication No. 1020000039659 A; Date of Publication: Jul. 5, 2000; in the name of U Yeong Kim et al.

Korean Patent Abstracts, Publication No. 1020010050783 A; Date of Publication: Jun. 25, 2001; in the name of Tsutomu Yamada.

Korean Patent Abstracts, Publication No. 1020020025842 A, dated Apr. 4, 2002, in the name of Katsuya Anzai et al.

Korean Patent Abstracts, Publication No. 1020020040613 A, dated May 30, 2002, in the name of Mitsuru Asano.

Korean Patent Abstracts, Publication No. 1020030086166 A; Date of Publication: Nov. 7, 2003; in the name of Gi Seong Chae et al.

Korean Patent Abstracts, Publication No. 1020040029242 A; Date of Publication: Apr. 6, 2004; in the name of Jong Cheol Chae et al.

U.S. Office action dated May 8, 2009, for related U.S. Appl. No. 11/129,016, noting listed references in this IDS.

S.M. Choi et al., *A Self-compensated Voltage Programming Pixel Structure for Active-Matrix Organic Light Emitting Diodes*, IDW 2003, Proceedings of the 10th Int'l Display Workshops, pp. 535-538, XP008057381.

Japanese Office action dated Apr. 7, 2009, for Japanese application 2005-306198, noting Japanese references listed in this IDS.

Chinese Patent Publication dated Oct. 7, 2009, for corresponding Chinese application 200510129187.6, noting listed references in this IDS, as well as CN 1376014 and CN 1530910, both previously filed in an IDS dated Feb. 20, 2008.

U.S. Office action dated Sep. 28, 2009, for related U.S. Appl. No. 11/129,016, noting listed U.S. Publication references in this IDS.

U.S. Office action dated Jul. 19, 2010, for related U.S. Appl. No. 11/129,016, noting listed reference in this IDS.

U.S. Office action dated Mar. 4, 2010, for related U.S. Appl. No. 11/129,016, noting listed reference in this IDS.

U.S. Office action dated Feb. 18, 2010, for related U.S. Appl. No. 12/247,171, noting listed reference in this IDS.

\* cited by examiner

LIGHT EMITTING DISPLAY AND LIGHT EMITTING DISPLAY PANEL

CROSS-REFERENCE TO RELATED APPLICATION

This application claims priority to and the benefit of Korean Patent Application No. 10-2004-0081627 filed in the Korean Intellectual Property Office on Oct. 13, 2004, the entire content of which is incorporated herein by reference.

FIELD OF THE INVENTION

The present invention relates to a light emitting display device, and more particularly, relates to an organic light emitting diode (hereinafter "OLED") display using electro-luminescence of an organic material.

BACKGROUND OF THE INVENTION

In general, an organic light emitting diode display is a display device that electrically excites fluorescent organic material for emitting light and visualizes an image by voltage programming or current programming of N×M numbers of organic light emitting cells.

Such organic light emitting cells are called organic light emitting diodes (OLED) because they have a diode characteristic. An OLED includes anode (e.g., indium tin oxide), organic thin film, and cathode (metal) layers. The organic thin film has a multi-layer structure, including an emitting layer (EML), an electron transport layer (ETL), and a hole transport layer (HTL), to balance electrons and holes and thereby enhance light emitting efficiency. Further, the organic thin film separately includes an electron injection layer (EIL) and a hole injection layer (HIL). The N×M organic light emitting cells arranged in the matrix format form an OLED display panel.

Figure 1:
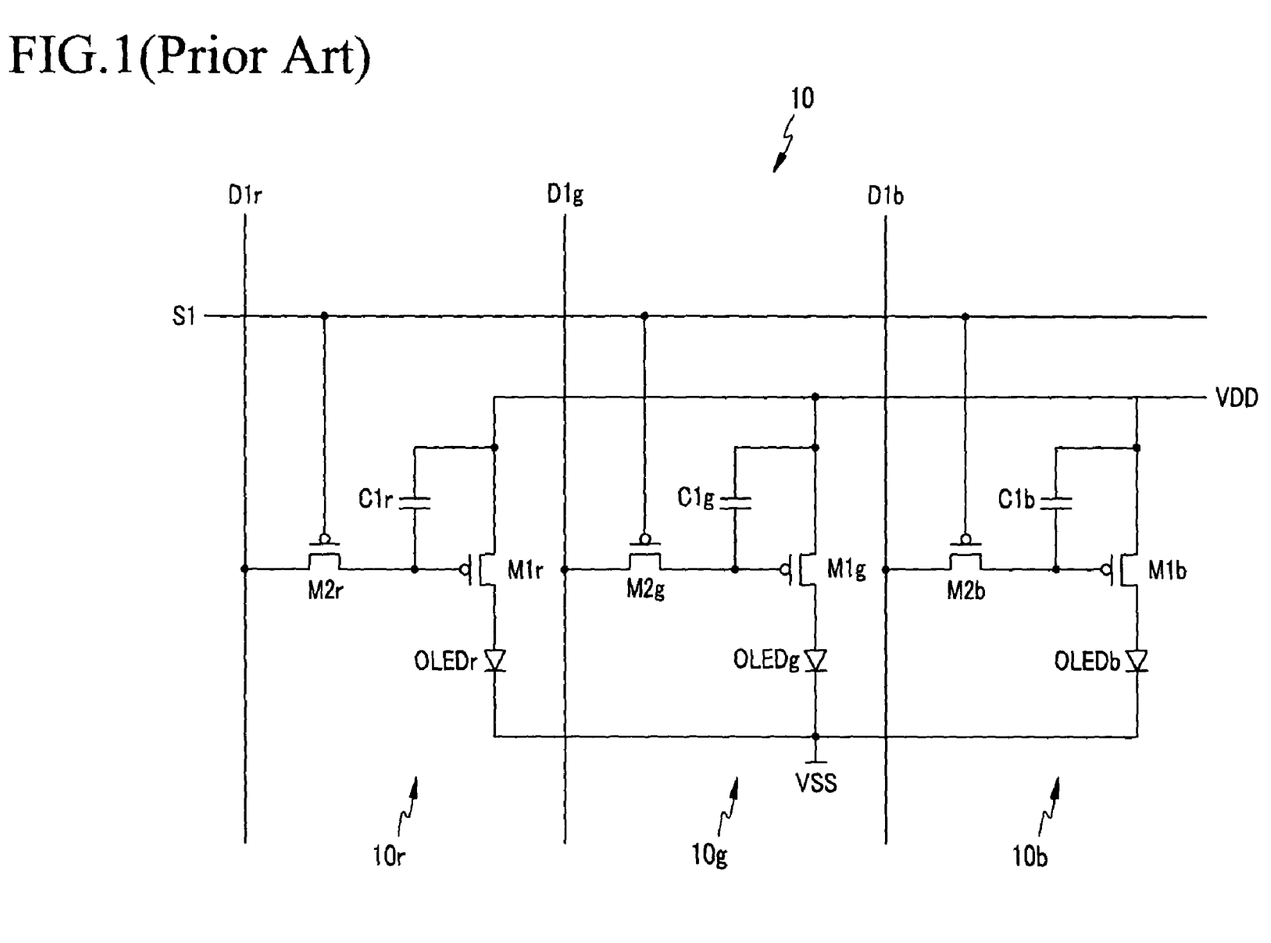
FIG. 1 shows a pixel circuit of a conventional light emitting display panel.

Methods of driving the organic light emitting cells having the foregoing configuration include a passive matrix method and an active matrix method employing a thin film transistor (TFT) or a MOSFET. In the passive matrix method, an anode and a cathode are formed crossing each other and a line is selected to drive the organic light emitting cells. However, in the active matrix method, an indium tin oxide (ITO) pixel electrode is coupled to a TFT and the light emitting cell is driven in accordance with a voltage maintained by capacitance of a capacitor. Hereinafter, a pixel circuit of a general active matrix OLED display will be described. FIG. 1 is a diagram of an equivalent pixel circuit of the first pixel of the N×M pixels (i.e., a pixel positioned at the first column and the first row).

As shown in FIG. 1, a pixel 10 includes subpixels 10r, 10g, and 10b. The subpixels 10r, 10g, and 10b respectively include organic light emitting diodes OLEDr, OLEDg, and OLEDb emitting red (R), green (G) and blue (B) lights. In a striped structure of subpixels, the subpixels 10r, 10g, and 10b are coupled to different data lines D1r, D1g, and D1b, respectively and are coupled to a common scan line S1.

The subpixel 10r of red light includes two transistors M1r and M2r, and a capacitor C1r for driving the OLEDr. Similarly, the subpixel 10g of green light includes two transistors M1g and M2g, and a capacitor C1g, and the subpixel 10b of blue light includes two transistors M1b and M2b, and a capacitor C1b. The operations of these subpixels 10r, 10g, and 10b are the same, therefore, only the operation of the subpixel 10r will be described.

The driving transistor M1r is placed between a source voltage VDD and an anode of the OLEDr, and coupled thereto. The transistor M1r and transmits a current for light emission to the OLEDr. A cathode of the OLEDr is coupled to a voltage VSS that is lower than the source voltage VDD. A current passing through the driving transistor M1r is controlled by a data voltage applied by the switching transistor M2r. Here, the capacitor C1r is coupled to a source and a gate of the transistor M1r and sustains an applied voltage. The gate of the transistor M2r is coupled to the scan line S1 through which a scan signal containing on/off information is transmitted. The source of the transistor M2r is coupled to the data line D1r through which a data voltage for the red subpixel 10r is transmitted.

As described in the above, in the OLED display, one pixel 10 includes three subpixels 10r, 10g, and 10b, and each subpixel includes a driving transistor, a switching transistor, and a capacitor for driving an OLED. On each subpixel, a data line for transmitting data signals and a source line for transmitting the source voltage VDD are formed. Accordingly, in the pixel, a large number of transistors, capacitors, and wires for transmitting voltages and signals are necessary, and thus it is difficult to arrange all of the components in the pixel. Moreover, in order to decrease the aperture ratio of an OLED, the light emission area needs to become smaller.

The information disclosed in this Background of the Invention section is only for enhancement of understanding of the background of the invention and therefore, unless explicitly described to the contrary, it should not be taken as an acknowledgement or any form of suggestion that this information forms the prior art that is already known in this country to a person of ordinary skill in the art.

SUMMARY OF THE INVENTION

The present invention provides an organic light emitting diode (OLED) display using electro-luminescence of an organic material having an efficient arrangement of a pixel area An exemplary display device according to an embodiment of the present invention includes a plurality of scan lines for transmitting scan signals, a plurality of data lines for transmitting data signals, and a plurality of pixel circuits each coupled to a respective scan line and a respective data line. Each of the plurality of pixel circuits respectively includes a pixel driver, first, second, and third light emitting diodes, and first, second, and third switches. The pixel driver outputs a driving current corresponding to the respective data signal to an output terminal in response to the scan signal. The first, second, and third light emitting diodes respectively emit first, second, and third color lights in response to the driving current.

The first, second, and third switches respectively are coupled between the output terminal of the pixel driver and the first, second, and third light emitting diodes. The first, second, and third switches selectively transmit the driving current to the first, second, and third light emitting diodes. Two light emitting diodes among the first, second, and third light emitting diodes are arranged in a first line, and the remaining light emitting diode is arranged in a second line different from the first line.

In one embodiment, the first, second, and third light emitting diodes are arranged substantially in a form of a delta (Δ) shape.

In one embodiment, the first line and the second line are substantially parallel to the plurality of scan lines.

In one embodiment, the scan line is arranged between the first line and the second line.

In one embodiment, each of the plurality of pixel circuits include a first transistor, a first capacitor, and a second transistor. The first transistor transmits the data signal in response to the scan signal. The first capacitor stores a voltage corresponding to the data signal transmitted by the first transistor. The second transistor outputs a current corresponding to the data signal.

In one embodiment, each of the plurality of pixel circuits respectively include a third transistor, a fourth transistor, and a second capacitor. The third transistor allows the second transistor to be diode-connected. The first electrode of the fourth transistor is coupled to a first electrode of the first capacitor, and the second electrode is coupled to a second electrode of the first capacitor. The first electrode of the second capacitor is coupled to the second electrode of the fourth transistor, and the second electrode is coupled to a control electrode of the second transistor.

An exemplary display panel according to an embodiment of the present invention includes a plurality of scan lines for transmitting scan signals, a plurality of data lines for transmitting data signals, and a plurality of light emitting diodes for emitting light corresponding to the data signal in response to the scan signal. The display panel includes a first light emitting diode group and a second light emitting diode group. In the first light emitting diode group, first, second, and third light emitting diodes, respectively emitting lights of first, second, and third colors, are sequentially arranged in a row direction continuously.

In the second light emitting diode group, fourth, fifth, and sixth light emitting diodes, respectively emitting lights of the second, the third, and the first colors, are sequentially arranged in the row direction. The first, fourth, and fifth light emitting diodes emit light corresponding to a data signal one data line of the plurality of data lines in response to a scan signal transmitted by one scan line of the plurality of scan lines.

In one embodiment, the scan line is arranged between the first light emitting diode group and the second light emitting diode group.

In one embodiment, the second, third, and sixth light emitting diodes are driven by a scan signal transmitted through a scan line that is the same scan line applied to the first, fourth, and fifth light emitting diodes, and are driven by a data signal transmitted through a data line that is a different data line to the data line through which the data signal is transmitted to the first, fourth, and fifth light emitting diodes.

In one embodiment, the first light emitting diode is arranged between the fourth and fifth light emitting diodes in the column direction.

An exemplary display device according to an embodiment of the present invention includes a plurality of scan lines for transmitting scan signals, a plurality of data lines for transmitting data signals, and a plurality of pixel circuits coupled to a respective scan line and a respective data line.

Each of the plurality of pixel circuits includes a first transistor, a first capacitor, a second transistor, first, second, and third light emitting diodes, and first, second, and third switches. The first transistor transmits the data signal in response to the scan signal. The first capacitor stores a voltage corresponding to the data signal transmitted by the first transistor. The second transistor outputs a current corresponding to the data signal. The first, second, and third light emitting diodes respectively emit first, second, and third color lights in response to the current output by the second transistor. The first, second, and third switches selectively transmit the current transmitted by the second transistor to the first, second, and third light emitting diodes.

Here, the first, second, and third light emitting diodes are arranged substantially in a form of a delta (Δ) shape.

In another embodiment, the first, second, and third light emitting diodes are arranged substantially in a form of an inverted triangle (∇) shape.

In one embodiment, the plurality of pixel circuits respectively include a third transistor, a fourth transistor, and a second capacitor. The third transistor allows the second transistor to be diode-connected. The first electrode of the fourth transistor is coupled to a first electrode of the first capacitor, and the second electrode is coupled to a second electrode of the first capacitor. The first electrode of the second capacitor is coupled to the second electrode of the fourth transistor, and the second electrode is coupled to a control electrode of the second transistor.

In one embodiment, the present invention is a display device that includes a plurality of pixels for emitting light, each of the plurality of pixels including a first OLED, a second OLED and a third OLED; a plurality of scan lines for transmitting a plurality of scan signals; a plurality of data lines for transmitting a plurality of data signals; and a plurality of pixel circuits each coupled to a respective scan line and a respective data line, wherein each of the plurality of pixel circuits drives all of the first OLED, the second OLED and the third OLED of a respective pixel.

DETAILED DESCRIPTION

In the following detailed description, only certain exemplary embodiments of the present invention have been shown and described, simply by way of illustration. As those skilled in the art would realize, the described embodiments may be modified in various different ways, all without departing from the spirit or scope of the present invention.

Figure 2:
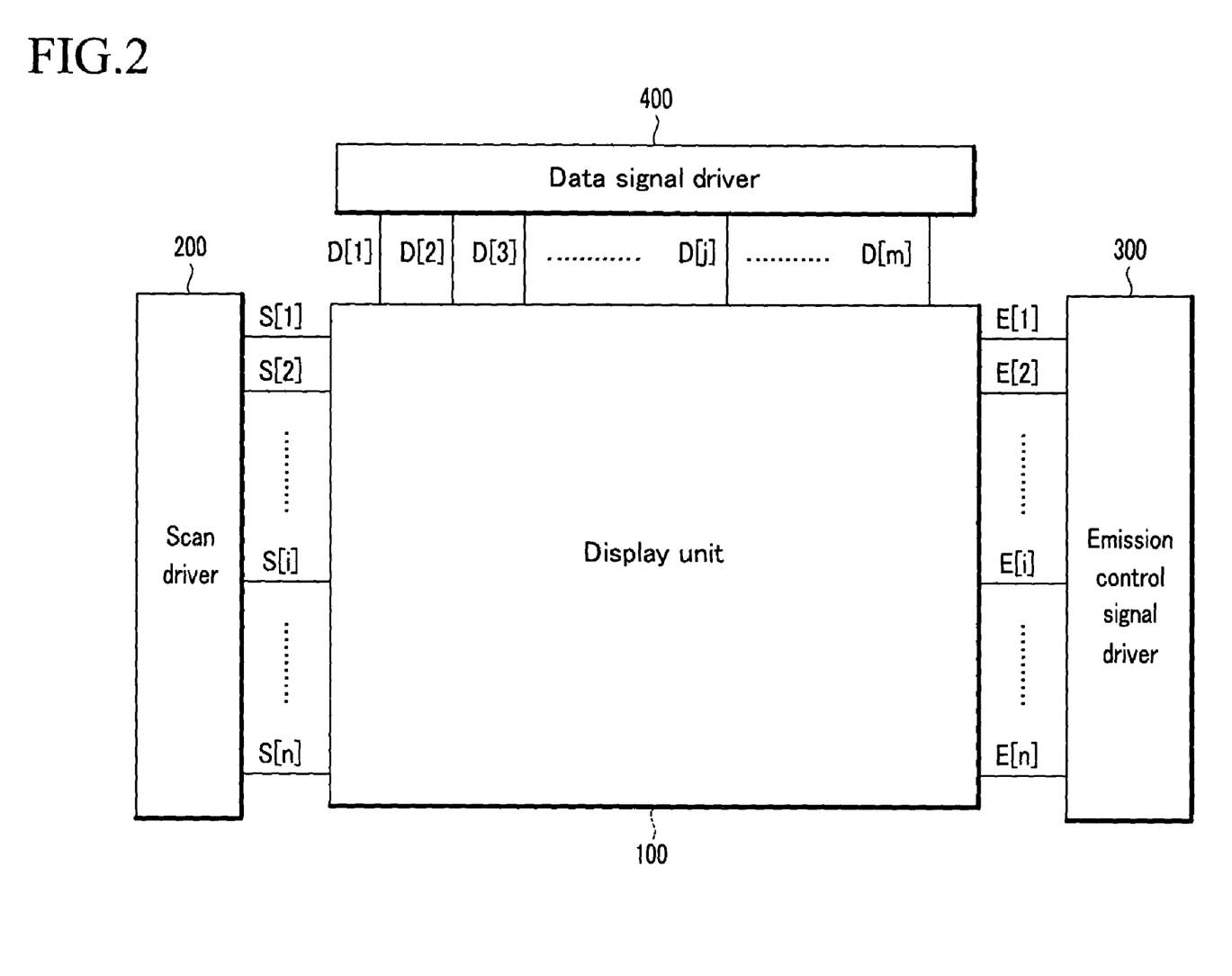
FIG. 2 is a block diagram of an OLED display according to a first embodiment of the present invention.

FIG. 2 is a block diagram of an OLED display according to a first embodiment of the present invention. As shown in FIG. 2, the OLED display includes a display unit 100, a scan driver 200, a light emission control signal driver 300, and a data signal driver 400.

The display unit 100 includes a plurality of scan lines S[1] to S[n] extended in a row direction, light emission control lines E[1] to E[n] extended in a row direction, and a plurality of data lines D[1] to D[m] extended in a column direction. Each light emission control line E[i] includes three light emission control lines E1[i], E2[i], and E3[i], not shown in FIG. 2.

The scan driver 200 applies scan signals sequentially to each of the scan lines S[1] to S[n], and the light emission control signal driver 300 applies a light emission control signal sequentially to each of the light emission control lines E[1] to E[n]. Every time the scan signal is sequentially applied, the data signal driver 400 applies a corresponding data signal to each of the data lines D[1] to D[m].

The scan driver 200, the light emission control signal driver 300, and the data signal driver 400 are coupled to a substrate on which the display unit 100 is formed. Alternatively, the scan driver 200, the light emission control signal driver 300, and the data signal driver 400 may be directly built on the substrate in a form of an integrated circuit. The drivers 200, 300, and 400 may be formed on the same layer on which the data lines, scan lines, light emission control lines, and transistors of the pixel circuit are formed on the substrate. Still alternatively, the drivers 200, 300, and 400 may be adhesively built on the substrate in the form of a chip coupled with a tape carrier package (TCP), a flexible printed circuit (FPC), or a tape automatic bonding (TAB).

Figure 3:
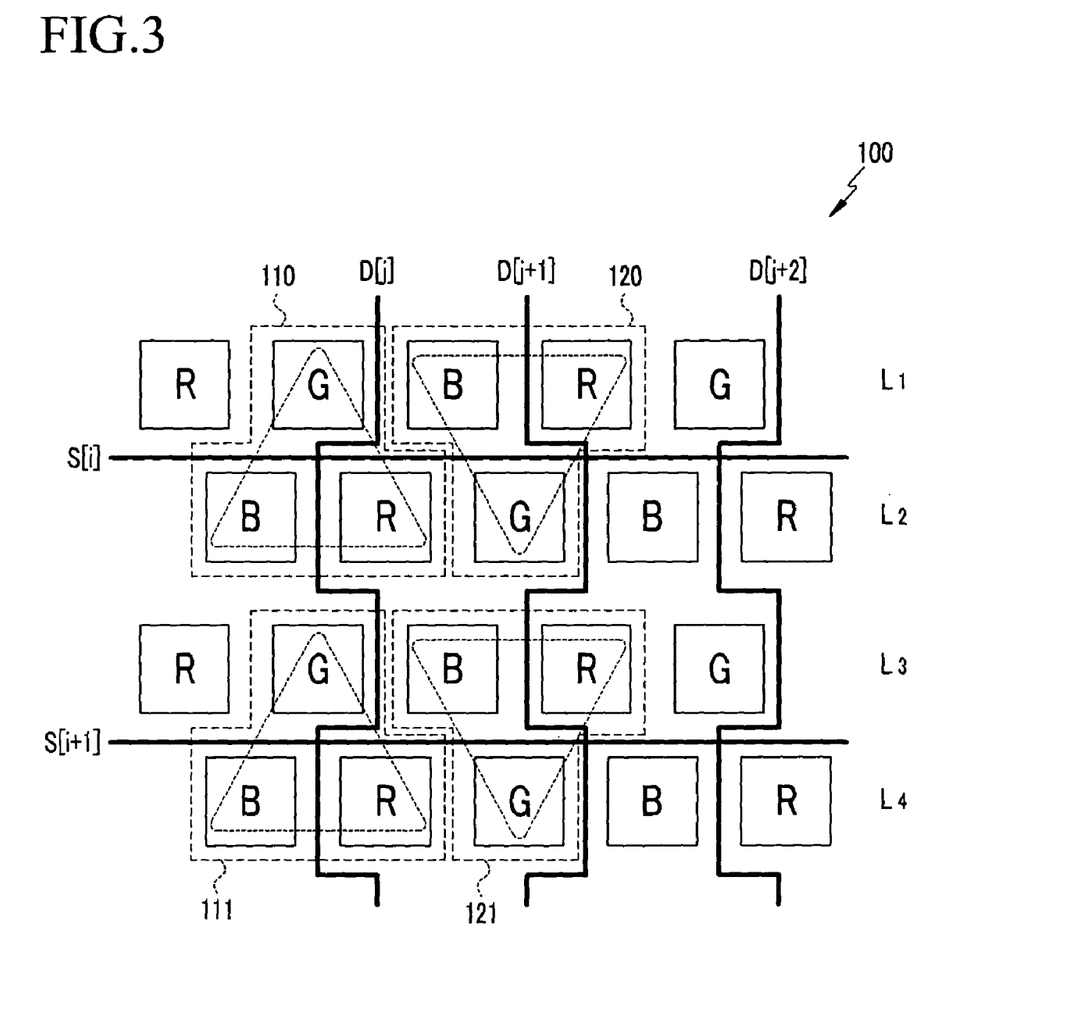
FIG. 3 shows a pixel arrangement of a display unit according to the first embodiment of the present invention.

FIG. 3 shows a pixel arrangement of a display unit 100 according to the first embodiment of the present invention. The pixels are arranged in a display unit 100. The pixels 110, 111, 120, and 121 are formed by three data lines D[j], D[j+1], and D[j+2] and two scan lines S[i], and S[i+1]. Here, j is an integer from 1 to m, and i is an integer from 1 to n. Therefore, the area illustrated in FIG. 3 is a part of a display unit 100 including a plurality of pixels formed by three arbitrary adjacent data lines and two arbitrary adjacent scan lines.

Pixel 110 operates in response to a scan signal transmitted through a scan line (i.e., S[i]) and a data signal transmitted through a data line D[j]. The pixel 110 includes an organic light emitting diode OLED_G emitting green light, an organic light emitting diode OLED_R emitting red light, and an organic light emitting diode OLED_B emitting blue light. Here, the OLED_G is arranged in an odd numbered line (i.e., L1), whilst the OLED_R, and the OLED_B are arranged in an even numbered line (i.e., L2). In other words, in the pixel 110, the three organic light emitting diodes OLED_G, OLED_R, and OLED_B are arranged in a delta (Δ) or triangle shape.

The next pixel, pixel 120 operates in response to a scan signal transmitted through a scan line (i.e., S[i]) and a data signal transmitted through a data line D[j+1]. The pixel 120 includes an OLED_G emitting green light, an OLED_R emitting red light, and an OLED_B emitting blue light. Here, the OLED_G is arranged in an even numbered line (i.e., L2 or L4), whilst the OLED_R, and the OLED_B are arranged in an odd numbered line (i.e., L1 or L3). In other words, in the pixel 120, the three organic light emitting diodes OLED_G, OLED_R, and OLED_B are arranged in a nabla (∇) or inverted triangle shape.

The scan line S[i] is arranged substantially parallel with the odd numbered line L1 and the even numbered line L2, therebetween, so that the scan line S[i] may be adjacent to both the OLED_G arranged in L1 and OLED_R and OLED_B arranged in L2.

Pixels 111 and 121 are arranged similarly. The scan line S[i+1] is arranged substantially parallel with the odd numbered line L3 and the even numbered line L4, therebetween, so that the scan line S[i+1] may be adjacent to both the OLED_G arranged in L3 and OLED_R and OLED_B arranged in L4. Therefore, the OLEDs on the even numbered line L2 operate in response to a scan signal transmitted through the scan line S[i], and the OLEDs on the odd numbered line L3 operate in response to a scan signal transmitted through the scan line S[i+1]. Therefore, no further scan line is necessary between the even numbered line L2 and the odd numbered line L3, and thus the number of scan lines can be decreased.

OLED cell pitches (i.e., intervals among the OLEDs) in the odd numbered line L1 and the even numbered line L2 are the same, but the OLEDs in the odd numbered line L1 are arranged to be shifted by half of one cell pitch in the row direction compared with those in the even numbered line L2. In other words, the phase difference of the arrangement between the odd numbered line L1 and even numbered line L2 in the row direction is half of the cell pitch for the two adjacent pixels to fit tightly. Due to this phase difference between odd numbered line L1 and even numbered line L2, the OLEDs forming one pixel are in the delta (Δ) shape or the nabla shape (∇).

Figure 4:
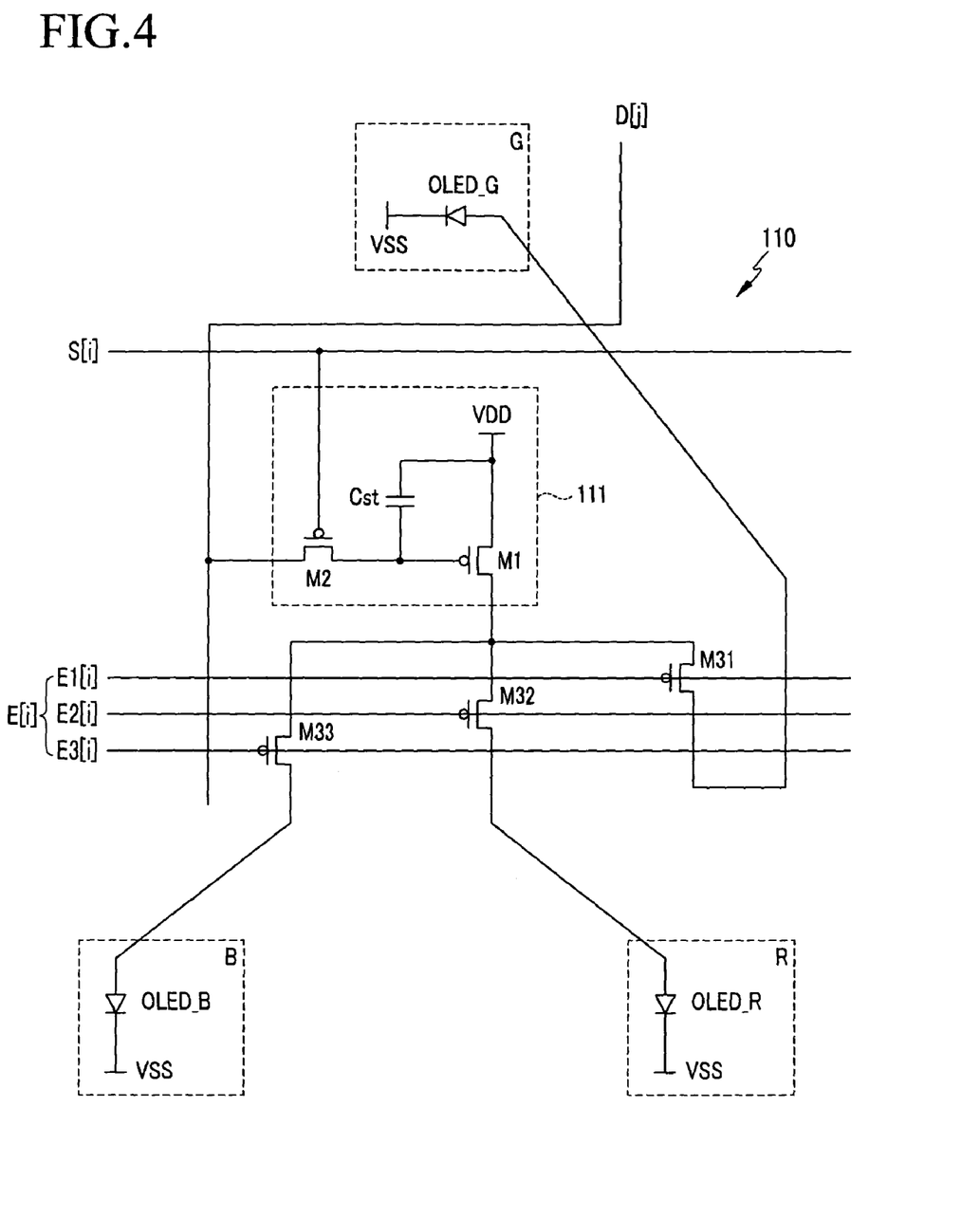
FIG. 4 is a diagram for an equivalent circuit of a pixel according to the first embodiment of the present invention.

FIG. 4 is a diagram for an equivalent circuit of a pixel according to the first embodiment of the present invention. For a better understanding and ease of description, numerals for the light emission control signals applied on the light emission control lines E1[i], E2[i], and E3[i] will be denoted with the same numerals as the numerals of the light emission control lines E1[i], E2[i], and E3[i], and a numeral for the scan signal applied on the scan line S[i] will also be denoted as S[i]. In the exemplary embodiment of FIG. 4, all transistors in the pixel 110 are illustrated to be p-channel transistors.

As shown in FIG. 4, pixel 110 includes a pixel driver 111 outputting a current $I_{OLED}$ corresponding to the data signal D[j] with reference to the scan signal S[i]. Transistors M31, M32, and M33 control the current $I_{OLED}$ generated by the pixel driver 111 to be transmitted selectively to the OLED_R, OLED_G and OLED_B. The organic light emitting diodes OLED_R, OLED_G, and OLED_B emit red light R, green light G, and blue light B, respectively.

The current $I_{OLED}$ corresponding to the data signal is applied to anodes of the organic light emitting diodes OLED_R, OLED_G, and OLED_B. A reference voltage Vss that is lower than a source voltage VDD is applied to cathodes of the organic light emitting diodes OLED_R, OLED_G, and OLED_B. For this reference voltage Vss, a negative voltage or a ground voltage may be used. The OLED_R, and OLED_B are placed in the same line, and the OLED_G is placed in an adjacent line to form a delta shape with the OLED_R and the OLED_B.

According to the first embodiment of the present invention, the pixel driver 111 receives the scan signal S[i] and the data signal D[j], and generates the current $I_{OLED}$ corresponding to the data signal D[j]. In addition, the pixel driver 111 includes a transistor M1, a transistor M2 and a capacitor Cst. In more detail, a source of the transistor M2 is coupled to the data line D[j], and a gate of the transistor M2 is coupled to the scan line S[i]. With regard to transistor M1, its source is coupled to the source voltage VDD, its gate is coupled to a drain of the transistor M2, and its drain forms an output terminal of the pixel driver 111. The capacitor Cst is coupled between the gate and the source of the transistor M1.

According to the first embodiment of the present invention, the pixel driver 111 includes the two transistors M1 and M2, and the capacitor Cst, but the pixel driver according to the present invention is not limited thereto. Any circuit, which outputs a current for controlling the OLEDs to emit light in correspondence with the data signal, may be used.

The source of the transistor M31 is coupled to the drain of the transistor M1, the gate is coupled to the light emission control line E1[i], and the drain is coupled to an anode of the OLED_G. The source of the transistor M32 is coupled to the drain of the transistor M1, the gate is coupled to the light emission control line E2[i], and the drain is coupled to an anode of the OLED_R. The source of the transistor M33 is coupled to the drain of the transistor M1, the gate is coupled to the light emission control line E3[i], and the drain is coupled to an anode of the OLED_B.

Therefore, when the transistor M31 is turned on in response to the light emission control signal E1[i], the current $I_{OLED}$, which is output from the drain of the transistor M1 (i.e., the output terminal of the pixel driver 111), is transmitted to the OLED_G. When the transistor M32 is turned on in response to the light emission control signal E2[i], the current $I_{OLED}$ is transmitted to the OLED_R. When the transistor M33 is turned on in response to the light emission control signal E3[i], the current $I_{OLED}$ is transmitted to the OLED_B.

According to the first embodiment of the present invention, one field is divided into three subfields, and a light emission is performed by respectively programming green, red, and blue. For the light emission, a scan driver sequentially transmits the scan signal to each of the scan lines S[1] to S[n] in every subfield. A light emission control signal driver applies the light emission control signal to the light emission control lines E1[1] to E1[n], E2[1] to E2[n], and E3[1] to E3[n] to control the OLEDs to emit respective colors of light in one subfield. A data signal driver applies the data signal corresponding to the respective OLEDs of green, red, and blue in the three subfields to the data lines D[1] to D[m].

Figure 5:
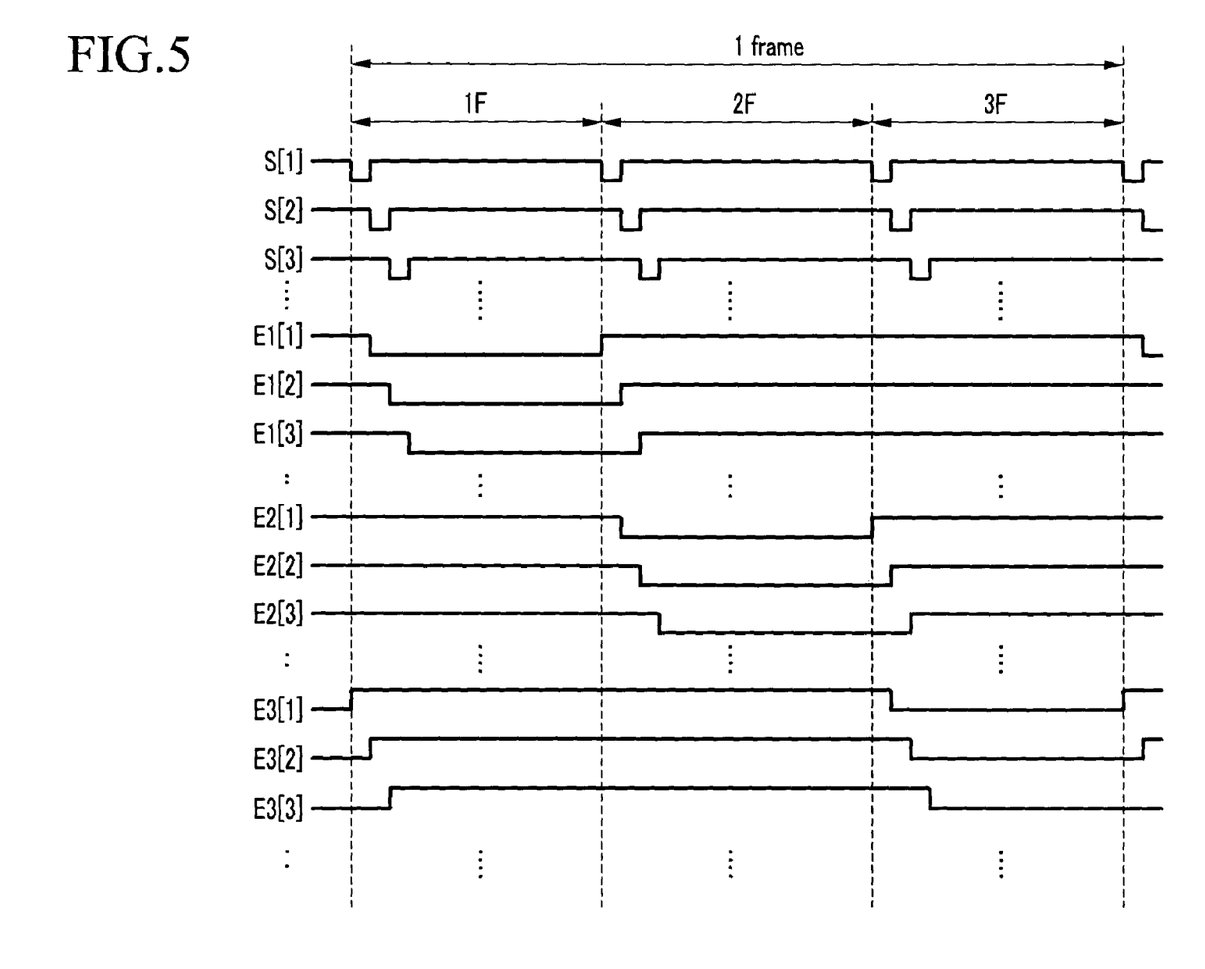
FIG. 5 illustrates waveforms of signals applied to a display unit.

FIG. 5 illustrates waveforms of signals applied to the display unit 100. Referring to FIG. 5, an operation of the OLED display according to the first embodiment of the present invention will be described. In the OLED display according to the first embodiment of the present invention, a frame is divided into three fields 1F, 2F, and 3F, and the scan signals S[1] to S[n] are sequentially applied during each field 1F, 2F, and 3F. The OLED_G, the OLED_R, and the OLED_B, co-owning the pixel driver 111, respectively emit light during a corresponding period in one field. Here, the fields 1F, 2F, and 3F may be respectively defined depending on each line. In FIG. 5, the fields 1F, 2F, and 3F are illustrated on the basis of the scan line S[1] in the first line. Hereinafter, the operation of the display device will be described on the basis of the scan line S[1] in the first line.

In the first field 1F, when a low level scan signal is applied on the present scan line S[1], the transistor M2 is turned on, and then a data voltage Vdata transmitted through the data line is applied to the gate of the transistor M1 (i.e., an end of the capacitor Cst). Therefore, a voltage which corresponds to the difference between the source voltage VDD and the data voltage Vdata is stored in the capacitor Cst. In other words, a voltage $V_{GS}$, which is applied between the gate and the source of the transistor M1, is stored in the capacitor Cst. The current $I_{OLED}$ corresponding to the charged voltage $V_{GS}$ flows out though the drain of the transistor M1. The current $I_{OLED}$ output through the drain of the transistor M1 is represented by Equation 1.

$$I_{OLED} = \frac{\beta}{2}(V_{GS} - V_{TH})^2 = \frac{\beta}{2}(V_{DD} - V_{DATA} - |V_{TH}|)^2 \quad \text{[Equation 1]}$$

Here, $V_{TH}$ indicates a threshold voltage of the transistor M1, and $\beta$ indicates a constant value.

Next, when the light emission control signal E1[1] becomes low level, the transistor M31 is turned on, and the current $I_{OLED}$ flowing out through the drain of the transistor M1 is transmitted to the anode of the OLED_G. Then, the OLED_G emits light in response to the current $I_{OLED}$.

In FIG. 5, the case in which the light emission control signal E1[1] is in a high level while the present low level scan signal S[1] is being applied is only described, but the light emission control signal can also be in a low level while the present low level scan signal S[1] is being applied.

In the first field 1F, when the light emission control signal E1[1] is low and the OLED_G is emitting light, the light emission control signals E2[1] and E3[1] are maintained in the high level, the transistors M32 and M33 are turned off, and thus the current $I_{OLED}$ is not transmitted to the OLED_R or the OLED_B.

Similarly, in the second field 2F, when the low level scan signal is applied to the present scan line S[1], the transistor M2 is turned on, and then a data voltage Vdata transmitted through the data line is applied to the gate of the transistor M1 (i.e., an end of the capacitor Cst), similar to the first field 1F. Therefore, the voltage that corresponds to the difference between the source voltage VDD and the data voltage Vdata is stored in the capacitor Cst. In other words, the voltage $V_{GS}$ which is applied between the gate and the source of the transistor M1 is stored in the capacitor Cst, and the current $I_{OLED}$, corresponding to the charged voltage $V_{GS}$, flows out though the drain of the transistor M1.

When the light emission control signal E2[1] becomes low level, the transistor M32 is turned on, and the current $I_{OLED}$ flowing out through the drain of the transistor M1 is transmitted to the anode of the OLED_R. Then, the OLED_R emits light in response to the current $I_{OLED}$. In the second field 2F, while the light emission control signal E2[1] is low and the OLED_R is emitting light, the light emission control signals E1[1] and E3[1] are maintained in the high level, the transistors M31 and M33 are turned off, and thus the current $I_{OLED}$ is not transmitted to the OLED_G and the OLED_B.

In the third field 3F, when the low level scan signal is applied to the present scan line S[1], the current $I_{OLED}$ flows out through the drain of the transistor M1, similar to the first and second fields 1F and 2F.

When the light emission control signal E3[1] becomes low level, the transistor M33 is turned on, and the current $I_{OLED}$ flowing out through the drain of the transistor M1 is transmitted to the anode of the OLED_B. Then, the OLED_B emits light in response to the current $I_{OLED}$. In the third field 3F, while the light emission control signal E3[1] is low and the OLED_B is emitting light, the light emission control signals E1[1] and E2[1] are maintained in the high level, and the transistors M31 and M32 are turned off, and thus the current $I_{OLED}$ is not transmitted to the OLED_G and the OLED_R.

As described above, according to the first embodiment of the present invention, one pixel driver coupled to one scan line and one data line drives three OLEDs (i.e., OLED_G, OLED_R, and OLED_B), and therefore the number of the scan lines and the number of the data lines can be reduced compared with the case in which one pixel driver drives one OLED.

In addition, the three OLEDs, which are driven by one pixel driver coupled to the scan line, are arranged in the form of a delta (Δ) shape laid in both an even numbered line and an odd numbered line, and thereby a plurality of OLEDs laid in two lines can be driven by one scan line. Therefore, the number of scan lines can be further reduced.

Moreover, when arranging the OLEDs R, G, and B in a line according to the conventional scheme, a plurality of OLEDs are extended in a column direction, and therefore it is difficult to obtain a reliable deposition of the OLED. However, by arranging the three OLEDs (i.e., OLED_G, OLED_R, and OLED_B) in the form of a delta (Δ) shape, a finer deposition of the OLEDs becomes possible and the reliability of the OLEDs can be improved, compared with the conventional case of arranging the OLEDs in a single line.

Figure 6:
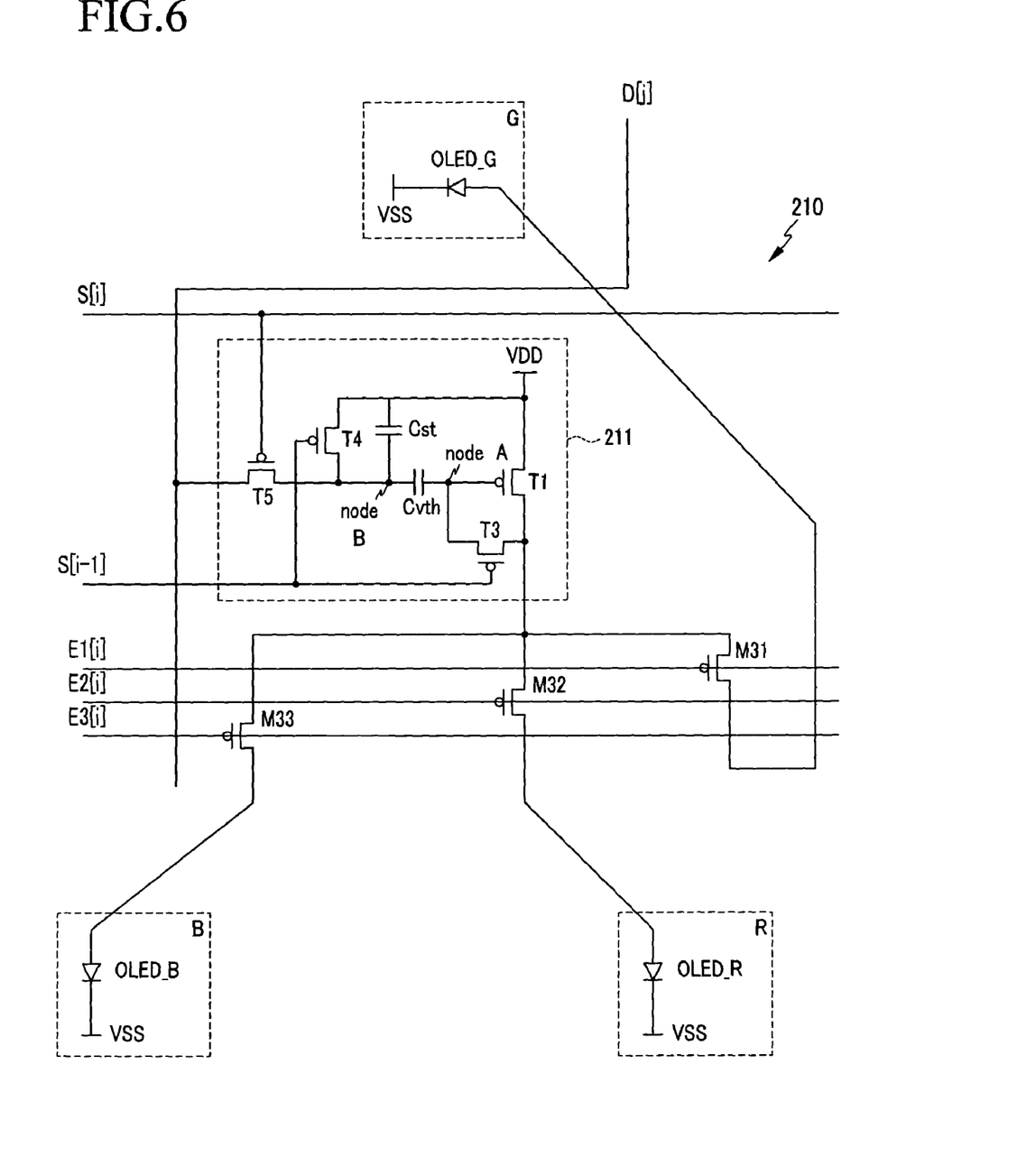
FIG. 6 is a diagram for an equivalent circuit of a pixel of an OLED display according to a second embodiment of the present invention.

FIG. 6 is a diagram for an equivalent circuit of a pixel 210 of the OLED display according to a second embodiment of the present invention. The OLED display according to the second embodiment of the present invention is different from the OLED display according to the first embodiment in that the pixel driver includes four transistors and two capacitors.

As shown in FIG. 6, the pixel 210 includes a pixel driver 211 for outputting the current $I_{OLED}$ corresponding to the data signal D[j] based on the scan signal S[i], transistors M31, M32, and M33 for controlling the current $I_{OLED}$ generated by the pixel driver 211 to be selectively transmitted, and organic light emitting diodes OLED_R, OLED_G, and OLED_B for emitting red (R), green (G), blue (B) lights. A detailed description for connection, operation, and arrangement of transistors M31, M32, and M33, and organic light emitting diodes OLED_R, OLED_G, and OLED_B in the second embodiment will be omitted since those are the same as in the first embodiment. Hereinafter, the pixel driver 211 will be described in more detail.

The pixel driver 211 includes four transistors and two capacitors (i.e., transistor T1, transistor T3, transistor T4, transistor T5, capacitor Cvth, and capacitor Cst).

In more detail, the transistor T5 includes a gate coupled to the present scan line S[i], and a source coupled to the data line D[j]. The transistor T5 transmits the data voltage to a node B of the capacitor Cvth in response to the scan signal from the scan line S[i]. The transistor T4 couples the node B of the capacitor Cvth to the source voltage VDD in response to the scan signal from the previous scan line S[i−1]. The transistor T3 allows the transistor T1 to be diode-connected in response to the scan signal from the previous scan line S[i−1]. The transistor T1 includes a gate coupled to a node A of the capacitor Cvth, and a source coupled to the source voltage VDD. The transistor T1 outputs a current to be applied to the OLEDs (i.e., OLED_G, OLED_R, and OLED_B) through its drain, which is an output terminal of the pixel driver 211, based on a voltage applied to its gate.

The first electrode of the capacitor Cst is coupled to the source voltage VDD, and the second electrode is coupled to the drain of the transistor T4 (i.e., node B). The first electrode of the capacitor Cvth is coupled to the second electrode of the capacitor Cst, so that the two capacitors are coupled in series, and the second electrode is coupled to the gate of the driving transistor T1 (i.e., node A).

The drain of the driving transistor T1 (i.e., the output terminal of the pixel driver 211) is coupled to sources of the transistors M31, M32, and M33, which are for controlling the OLEDs (i.e., OLED_G, OLED_R, and OLED_B) to selectively emit light, and gates of the transistors M31, M32, and M33 are respectively coupled to the light emission control lines E1[i], E2[i], and E3[i]. The drains of the transistors M31, M32, and M33 are respectively coupled to anodes of the OLEDs (i.e., OLED_G, OLED_R, and OLED_B).

Hereinafter, the operation of the pixel driver is be described. When the low level scan signal is applied to a previous scan line S[0], the transistors T3 and T4 are turned on. The transistor T1 is diode-connected, because the transistor T3 is turned on. Accordingly, a voltage difference between the gate and the source of the transistor T1 is changed till it reaches a threshold voltage Vth of the transistor T1. Since the source of the transistor T1 is coupled to the source voltage VDD, a voltage to be applied to the gate of the transistor T1 (i.e., the node A of the capacitor Cvth) is a sum of the source voltage VDD and the threshold voltage Vth. In addition, when the transistor T4 is turned on, the source voltage VDD is applied to the node B of the capacitor Cvth, and accordingly, a voltage $V_{Cvth}$ to be stored in the capacitor Cvth may be given by Equation 2.

$$V_{Cvth}=V_{CvthA}-V_{CvthB}=(VDD+Vth)-VDD=Vth \qquad \text{[Equation 2]}$$

Here, $V_{Cvth}$ indicates a voltage to be stored in the capacitor Cvth, $V_{CvthA}$ indicates a voltage to be applied to the node A of the capacitor Cvth, and $V_{CvthB}$ indicates a voltage to be applied to the node B of the capacitor Cvth.

While the low level scan signal is applied to a current scan line S[1] the transistor T5 is turned on, and thereby, the data voltage Vdata applied through the data line D1 is applied to the node B. Since a voltage corresponding to the threshold voltage Vth of the transistor T1 has been charged in the capacitor Cvth, a voltage corresponding to the sum of the data voltage Vdata and the threshold voltage Vth of the transistor T1 is applied to the gate of the transistor T1. Briefly, the voltage between the gate and the source of the transistor T1 is given in Equation 3.

$$Vgs=(Vdata+Vth)=VDD \qquad \text{[Equation 3]}$$

The current $I_{OLED}$ corresponding to the voltage $V_{GS}$ between the gate and the source of the transistor T1 is output through the drain of the transistor T1. Here, the current $I_{OLED}$ is given to be as show in Equation 4.

$$I_{OLED} = \frac{\beta}{2}(Vgs - Vth)^2 = \qquad \text{[Equation 4]}$$
$$\frac{\beta}{2}((Vdata + Vth - VDD) - Vth)^2 = \frac{\beta}{2}(VDD - Vdata)^2$$

Here, $I_{OLED}$ indicates a current to be output through the drain of the transistor T1, Vgs indicates the voltage between the source and the gate of the transistor T1, Vth indicates the threshold voltage of the transistor T1, Vdata indicates the data voltage, and β indicates a constant value.

Similar to the first embodiment, the transistors M31, M32, and M33 are turned on in the first, second, and third fields (1F, 2F, and 3F) respectively, in response to the light emission control signals E1[i], E2[i], and E3[i]. Then, the current $I_{OLED}$ output through the drain of the transistor T1 is transmitted to the OLEDs (i.e., OLED_G, OLED_R, and OLED_B), respectively.

As described above, according to the second embodiment of the present invention, the number of scan lines and data lines may be reduced similar to the first embodiment of the present invention. In addition, since the OLEDs (i.e., OLED_G, OLED_R, and OLED_B) are arranged in both an even numbered line and an odd numbered line in the form of a delta (Δ) shape, a finer deposition of the OLEDs becomes possible and the reliability of the OLEDs can be improved, compared with the case of arranging the OLEDs in a single line.

Moreover, according to the second embodiment of the present invention, the transistors T3 and T4, and the capacitor Cvth are provided additionally, and thereby the threshold voltage of the driving transistor T1 can be compensated. Accordingly, a phenomenon that the current $I_{OLED}$ is changed according to the threshold voltage of the driving transistor, and thereby a display characteristic is decreased, can be sufficiently prevented.

According to an embodiment of the present invention, one pixel driver coupled to one scan line and one data line drives OLEDs of three colors R, G, and B. Thereby, the number of scan lines and data lines may be reduced, compared with a case in which one pixel driver drives one OLED.

In addition, since the OLEDs of three colors R, G, and B driven by one pixel driver coupled to a scan line are arranged in both an even numbered line and an odd numbered line in the form of a delta (Δ) shape, a plurality of OLEDs arranged in the two lines are driven by one scan line, and the number of the scan lines are further reduced.

Since the OLEDs of three colors R, G, and B are arranged in both an even numbered line and an odd numbered line in the form of a delta (Δ) shape, a finer deposition of the OLEDs becomes possible and the reliability of OLEDs can be improved, compared with the case of arranging the OLEDs in a single line.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device for emitting light comprising: a plurality of scan lines for transmitting scan signals; a plurality of data lines for transmitting data signals; and a plurality of pixel circuits each coupled to a respective scan line and a respective data line, wherein each of the plurality of pixel circuits comprises:
    a pixel driver for outputting a driving current corresponding to a respective data signal to an output terminal in response to a respective scan signal;
    first, second, and third light emitting elements for emitting first, second, and third color lights respectively, in response to the driving current; and
    first, second, and third switches respectively being coupled between the output terminal of the pixel driver and the first, second, and third light emitting elements, wherein the first, second, and third switches selectively transmit the driving current to the first, second, and third light emitting elements respectively,
    wherein two light emitting elements among the first, second, and third light emitting elements are arranged in a respective horizontal first line, and the remaining one light emitting element is arranged in a respective horizontal second line different from the respective first line such that the first, second, and third light emitting elements are arranged in a triangular shape, wherein
    a first pixel circuit and a second pixel circuit from the plurality of pixel circuits are arranged such that the first, second, and third light emitting elements of the pixel circuits are divided on both sides of a first scan line and in inverted relation between a horizontal first odd numbered line and a horizontal second even numbered line adjacent and parallel to the first odd numbered line, and both of the first pixel circuit and the second pixel circuit are responsive to said first scan line arranged in parallel with the first odd numbered line and the second even numbered line, wherein
    a third pixel circuit and a fourth pixel circuit from the plurality of pixel circuits are arranged such that the first, second, and third light emitting elements of the pixel circuits are divided on both sides of a second scan line subsequent and parallel to said first scan line and in inverted relation between a horizontal third odd numbered line adjacent and parallel to the second even numbered line and a horizontal fourth even numbered line adjacent and parallel to the third odd numbered line, and both of the third pixel circuit and the fourth pixel circuit are responsive to said second scan line arranged in parallel with the third odd numbered line and the fourth even numbered line, wherein
    the first, second and third light emitting elements of the first pixel circuit and the first, second and third light emitting elements of the third pixel circuit correspond to a same first data line, wherein
    the first, second and third light emitting elements of the second pixel circuit and the first, second and third light emitting elements of the fourth pixel circuit correspond to a same second data line, and wherein
    said first scan line is configured to select any of the three light emitting elements of the first and second pixel circuits and said second scan line is configured to select any of the three light emitting elements of the third and fourth pixel circuits, and the first, second, and third switches respectively control the output from the first and second data lines to the first, second, and third light emitting elements of the respective pixel circuits, and wherein the pixel driver comprises:
    a first transistor having a gate coupled to a present scan line and a source coupled to a respective data line for transmitting the data signal in response to the present scan signal;
    a first capacitor having first and second nodes, the first node coupled to a drain of the first transistor and the second node coupled to a power signal for storing a voltage corresponding to the data signal transmitted by the first transistor;
    a second transistor having a gate, a first electrode, and a second electrode coupled to the power signal for outputting a current corresponding to the data signal to be applied to the first, second, and third light emitting elements;
    a third transistor coupled between the gate and the second electrode of the second transistor and having a gate coupled to a previous scan line for allowing the second transistor to be diode-connected in response to the previous scan line;
    a fourth transistor having a first electrode coupled to the first node of the first capacitor, and a second electrode coupled to the second node of the first capacitor and the power signal; and
    a second capacitor having a first node coupled to the first electrode of the fourth transistor, and a second node coupled to the gate of the second transistor.

2. The display device of claim 1, wherein the first, second, and third light emitting elements of a portion of the plurality of pixel circuits are arranged substantially in a form of a delta (Δ) shape.

3. A display panel for emitting light comprising: a plurality of scan lines for transmitting scan signals; a plurality of data lines for transmitting data signals; and a plurality of light emitting elements for emitting light corresponding to the data signals in response to the scan signals, the display panel comprising:
    a first light emitting element group in which first, second, and third light emitting elements respectively emitting lights of first, second, and third colors are arranged in a triangular shape;
    a second light emitting element group next to the first light emitting element group in a row direction in which fourth, fifth, and sixth light emitting elements respectively emitting lights of the second, third, and first colors are arranged in an inverted triangular shape with respect to the first, second, and third light emitting elements of the first light emitting element group, wherein the first and second light emitting element groups correspond to a first scan line;

a third light emitting element group in which seventh, eighth, and ninth light emitting elements respectively emitting lights of the first, second, and third colors are arranged in a triangular shape below and in accordance with the first light emitting element group in a column direction, wherein the first, second and third light emitting elements of the first light emitting element group and the seventh, eighth, and ninth light emitting elements of the third light emitting element group correspond to a same first data line;

a fourth light emitting element group next to the third light emitting element group in a row direction and below the second light emitting element group in a column direction, in which tenth, eleventh, and twelfth light emitting elements respectively emitting lights of the second, third, and first colors are arranged in an inverted triangular shape in accordance with the second light emitting element group, wherein the fourth, fifth, and sixth light emitting elements of the second light emitting element group and the tenth, eleventh, and twelfth light emitting elements of the fourth light emitting element group correspond to a same second data line, wherein the third and fourth light emitting element groups correspond to a second scan line arranged in parallel to and adjacently below the first scan line, wherein the first, fourth and fifth light emitting elements are arranged in one side of the first scan line, and the second, third and sixth light emitting elements are arranged in another side of the first scan line, and wherein the seventh, tenth and eleventh light emitting elements are arranged in one side of the second scan line, and the eighth, ninth and twelfth light emitting elements are arranged in another side of the second scan line; and a plurality of pixel drivers for outputting respective driving currents to the light emitting element groups corresponding to a respective data signal in response to a respective scan signal wherein each light emitting element group comprises first, second, and third switches respectively being coupled between an output terminal of each pixel driver and the respective light emitting elements of each pixel group, wherein the first, second, and third switches selectively transmit the driving current to the respective light emitting elements of the pixel group by controlling the output from the respective light emitting element groups, wherein each pixel driver comprises:

a first transistor having a gate coupled to a present scan line and a source coupled to a respective data line for transmitting the data signal in response to the present scan signal, a first capacitor having first and second nodes, the first node coupled to a drain of the first transistor and the second node coupled to a power signal for storing a voltage corresponding to the data signal transmitted by the first transistor, a second transistor having a gate, a first electrode, and a second electrode coupled to the power signal for outputting a current corresponding to the data signal to be applied to a respective light emitting element group, a third transistor coupled between the gate and the second electrode of the second transistor and having a gate coupled to a previous scan line for allowing the second transistor to be diode-connected in response to the previous scan line;

a fourth transistor having a first electrode coupled to the first node of the first capacitor, and a second electrode coupled to the second node of the first capacitor and the power signal; and a second capacitor having a first node coupled to the first electrode of the fourth transistor, and a second node coupled to the gate of the second transistor.

4. A display device comprising:

a plurality of pixels for emitting light, each of the plurality of pixels including a first organic light emitting diode (OLED), a second OLED and a third OLED;

a plurality of scan lines for transmitting a plurality of scan signals;

a plurality of data lines for transmitting a plurality of data signals; and a plurality of pixel circuits each coupled to a respective scan line and a respective data line, wherein each of the plurality of pixel circuits drives the first OLED, the second OLED and the third OLED of a respective pixel wherein the first OLED, the second OLED, and the third OLED of each of the plurality of pixels are arranged in a triangular shape, and wherein a first pixel and a second pixel from the plurality of pixels are arranged such that the first OLED, the second OLED, and the third OLED of the first pixel and the second pixel are divided on both sides of a first scan line and in inverted relation between a horizontal first odd numbered line and a horizontal second even numbered line adjacent and parallel to the first odd numbered line, and both of the first pixel and the second pixel are responsive to said first scan line arranged in parallel with the first odd numbered line and the second even numbered line, wherein a third pixel and a fourth pixel from the plurality of pixels are arranged such that the first OLED, the second OLED, and the third OLED of the first pixel and the second pixel are divided on both sides of a second scan line subsequent and parallel to said first scan line and in inverted relation between a horizontal third odd numbered line adjacent and parallel to the second even numbered line and a horizontal fourth even numbered line adjacent to the third odd numbered line, and both of the third pixel and the fourth pixel are responsive to said second scan line arranged in parallel with the third odd numbered line and the fourth even numbered line, wherein the first, second and third light emitting elements of the first pixel circuit and the first, second and third light emitting elements of the third pixel circuit correspond to a same first data line, wherein the first, second and third light emitting elements of the second pixel circuit and the first, second and third light emitting elements of the fourth pixel circuit correspond to a same second data line, and wherein said first scan line is configured to select any of the three light emitting elements of the first and second pixel circuits and said second scan line is configured to select any of the three light emitting elements of the third and fourth pixel circuits, and wherein each of the plurality of pixel circuits comprises:

a pixel driver for outputting a driving current corresponding to a respective data signal to an output terminal in response to a respective scan signal wherein each pixel circuit comprises first, second, and third switches respectively being coupled between the output terminal of the pixel driver and the first OLED, the second OLED, and the third OLED, wherein the first, second, and third switches selectively transmit the driving current to the first OLED, the second OELD, and the third OLED respectively, by controlling the output from the respective pixel circuits, the pixel driver comprising:
- a first transistor having a gate coupled to a present scan line and a source coupled to a respective data line for transmitting the data signal in response to the present scan signal,
- a first capacitor having first and second nodes, the first node coupled to a drain of the first transistor and the second node coupled to a power signal for storing a voltage corresponding to the data signal transmitted by the first transistor,
- a second transistor having a gate, a first electrode, and a second electrode coupled to the power signal for outputting a current corresponding to the data signal to be applied to a respective OLED of the first OLED, the second OLED and the third OLED of a respective pixel,
- a third transistor coupled between the gate and the second electrode of the second transistor and having a gate coupled to a previous scan line for allowing the second transistor to be diode-connected in response to the previous scan line;
- a fourth transistor having a first electrode coupled to the first node of the first capacitor, and a second electrode coupled to the second node of the first capacitor and the power signal; and
- a second capacitor having a first node coupled to the first electrode of the fourth transistor, and a second node coupled to the gate of the second transistor.

5. The display device of claim 4, wherein the first OLED, the second OLED and the third OLED of a respective pixel are arranged in a form of a delta (Δ) shape.

6. The display device of claim 4, wherein the first OLED, the second OLED and the third OLED of a respective pixel are arranged in a form of an inverted triangle (∇) shape.

7. The display device of claim 1, wherein the same first data line is bent within the first pixel circuit and the third pixel circuit, and the same second data line is bent within the second pixel circuit and the fourth pixel circuit.

8. The display device of claim 3, wherein the same first data line is bent within the first pixel circuit and the third pixel circuit, and the same second data line is bent within the second pixel circuit and the fourth pixel circuit.

9. The display device of claim 4, wherein the same first data line is bent within the first pixel circuit and the third pixel circuit, and the same second data line is bent within the second pixel circuit and the fourth pixel circuit.

* * * * *